(12) United States Patent
Lesea et al.

(10) Patent No.: US 7,759,801 B1
(45) Date of Patent: Jul. 20, 2010

(54) TAPERED SIGNAL LINES

(75) Inventors: Austin H. Lesea, Los Gatos, CA (US); Peter H. Alfke, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 288 days.

(21) Appl. No.: 11/903,016

(22) Filed: Sep. 19, 2007

Related U.S. Application Data (62) Division of application No. 10/627,334, filed on Jul. 24, 2003, now Pat. No. 7,291,923.

(51) Int. Cl.
*H01L 23/48* (2006.01)

(52) U.S. Cl. .............. 257/775; 257/E23.152; 257/E23.144; 257/E23.167; 257/E27.141; 257/773; 257/644; 257/665; 257/776

(58) Field of Classification Search .......... 257/775, 257/E23.152, E23.144, E23.167, E27.141, 257/773, 644, 665, 776
See application file for complete search history.

(56) References Cited

U.S. PATENT DOCUMENTS

| | | | |
|---|---|---|---|
| 4,679,088 A | | 7/1987 | Chiyoma et al. |
| 5,737,580 A | * | 4/1998 | Hathaway et al. ............. 716/12 |
| 6,043,704 A | * | 3/2000 | Yoshitake .................. 327/565 |
| 6,788,561 B2 | | 9/2004 | Watanabe et al. |
| 6,992,394 B2 | | 1/2006 | Park et al. |
| 7,028,282 B2 | | 4/2006 | Roohparvar |
| 7,291,923 B1 | * | 11/2007 | Lesea et al. ................. 257/775 |
| 2003/0181018 A1 | | 9/2003 | Geusic et al. |
| 2004/0169260 A1 | | 9/2004 | Sylvester et al. |
| 2004/0266183 A1 | | 12/2004 | Miller et al. |
| 2009/0027137 A1 | * | 1/2009 | Fjelstad et al. ................ 333/34 |

\* cited by examiner

*Primary Examiner*—Alexander O Williams
(74) *Attorney, Agent, or Firm*—W. Eric Webostad; John J. King (57) ABSTRACT

A first wire having sidewalls of an integrated circuit is tapered from the proximal end to the distal end to reduce width from the first width to the second width. A second wire, spaced apart from the first wire, the second wire has sidewalls. The first wire and the second wire are each horizontally disposed along side each other forming a part of a sidewall capacitor between facing sidewalls. The sidewall capacitor capacitance is progressively reduced responsive to the first wire taper.

20 Claims, 12 Drawing Sheets

TAPERED SIGNAL LINES

FIELD OF THE INVENTION

One or more aspects of the present invention relate generally to tapered signal lines, and more particularly to tapered clock lines for clock distribution.

BACKGROUND OF THE INVENTION

Forming conductors on integrated circuits to provide signal lines is well known. More recently, due to smaller lithographies allowing signal lines to be placed closer together, crosstalk and parasitic capacitance between lines has become more predominant.

Figure 1:
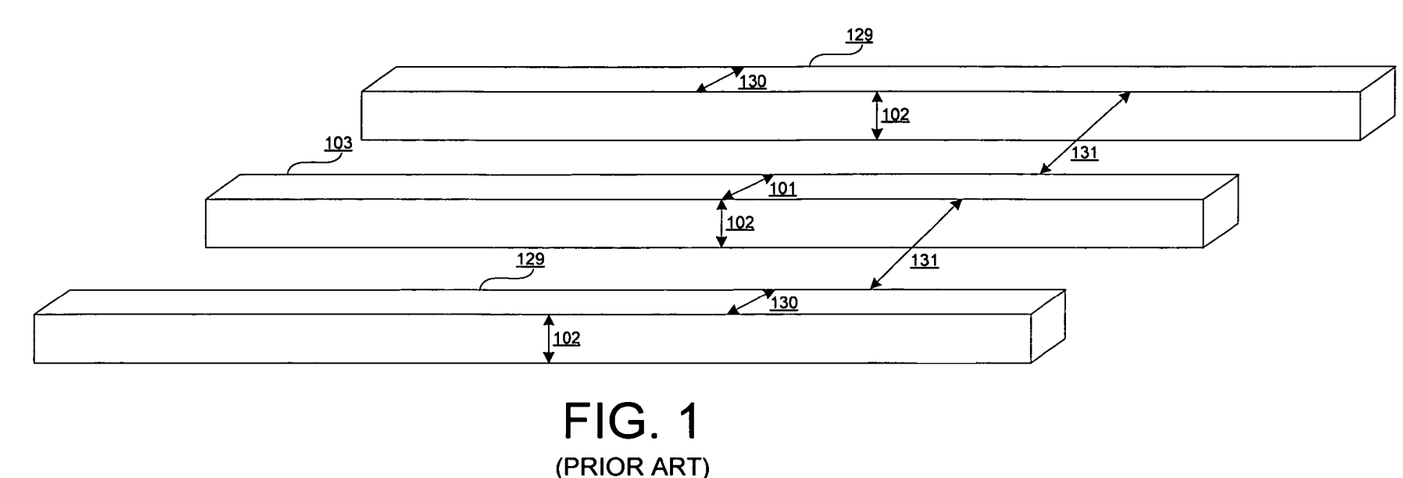
FIG. 1 is a perspective view depicting an exemplary embodiment of a non-tapered signal line of the prior art.

Referring to FIG. 1, there is shown a perspective view depicting an exemplary embodiment of a non-tapered signal line 103 of the prior art, which may be disposed in a conductive layer ("metal layer") of an integrated circuit. Non-tapered signal line 103 is conventionally disposed in a horizontal orientation, latitudinal or longitudinal orientation, with respect to an integrated circuit, where via interconnects are formed to interconnect horizontally oriented signal lines or devices of different layers, as is known.

On either side of non-tapered signal line 103 are non-tapered shielding lines 129. Examples of non-tapered shielding lines 129 may be ground lines or a direct current source voltage (e.g., Vcc) lines, namely, an alternating current ("AC") ground line. Conventionally, non-tapered shielding lines 129 and non-tapered signal line 103 are formed with at least approximately the same depth or height 102. Notably, conventionally, non-tapered signal line 103 is formed with at least approximately a same width 101 along its extent, and non-tapered shielding lines 129 are conventionally formed with approximately a same width 130 along its extent. However, conventionally non-tapered shielding lines 129 are formed with a minimum possible width, which may be substantially smaller than width of non-tapered signal lines 103. Furthermore, conventionally, non-tapered shielding lines 129 are at least approximately spaced a same spacing distance 131 from non-tapered signal line 103. In other words, non-tapered lines 103 and 129 are conventionally designed to have a same sidewall height 102 and spatial separation 131 from beginning to end, though, when formed, some variation may result.

Figure 2:
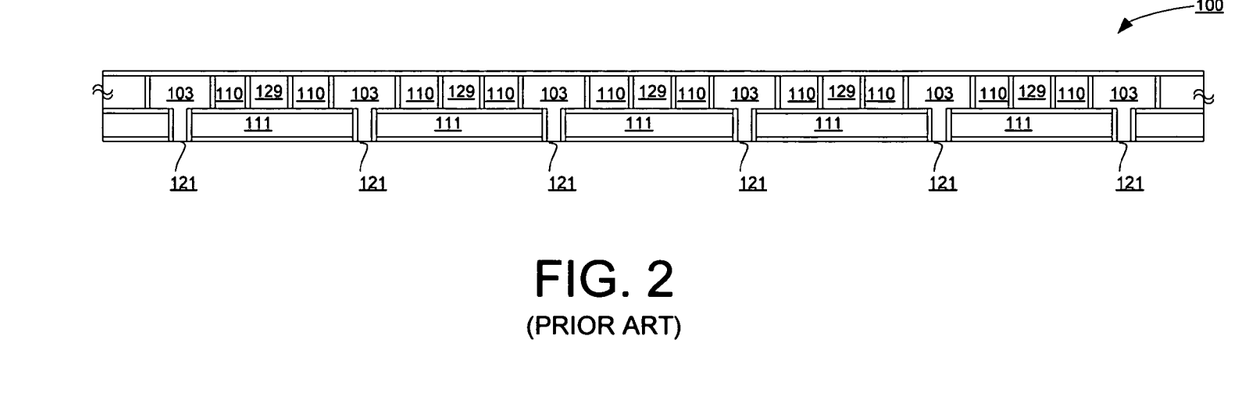
FIG. 2 is a cross-sectional view depicting an exemplary embodiment of non-tapered signal lines disposed in a portion of an integrated circuit of the prior art.

Referring to FIG. 2, there is shown a cross-sectional view depicting an exemplary embodiment of non-tapered signal lines 103 disposed in a portion of an integrated circuit 100 of the prior art. For example, a conductive material may be used to form non-tapered signal lines 103 and a same or different conductive material may be used to form interconnect lines or via interconnects 121. Though a dual damascene flow is shown for forming signal lines 103 with via interconnects 121, it should be appreciated that via interconnects 121 and non-tapered signal lines 103 may be separately formed.

Interlayer dielectric layers 110 and 111 may be formed for defining trenches and vias, as is known. Thus, it should be appreciated that a sidewall parasitic capacitance exists between sidewalls of non-tapered signal lines 103 and non-tapered shielding lines 129 with interlayer dielectric 110, and any intervening barrier layer 131 sandwiched between such sidewalls. Accordingly, sidewall parasitic capacitance will be substantially the same along the extent of non-tapered signal line 103.

Conventional thought is that parasitic capacitance is a problem, namely, because it adds capacitance, C, and thus increases the resistance-capacitance, RC, time constant for signal propagation. In other words, parasitic capacitance delays signal propagation.

Accordingly, because parasitic capacitance is a fact of life in integrated circuit design, it would be both desirable and useful to re-arrange parasitic capacitances in order to improve integrated circuit performance.

SUMMARY OF THE INVENTION

An aspect of the invention is a layer in an integrated circuit including a plurality of conductive wires. The layer comprises a first wire and a second wire. The first wire has a proximal end and a distal end, where the proximal end has a first width and the distal end has a second width less than the first width. The first wire is tapered from the proximal end to the distal end to reduce width from the first width to the second width. The first wire has first sidewalls. The second wire is spaced apart from the first wire and has second sidewalls. The first wire and the second wire are each horizontally disposed along side each other, where a sidewall capacitor is created with a first sidewall of the first sidewalls and a first sidewall of the second sidewalls. The incremental sidewall capacitor capacitance is progressively reduced as a result of the first wire taper.

Another aspect of the invention is an integrated circuit conductive line. The integrated circuit conductive line comprises a plurality of loads progressively reduced responsive to progressively reduced parasitic capacitance; and a plurality of taps, where a tap of the plurality of taps is located between a pair of loads of the plurality of loads Another aspect of the invention is a method for forming a portion of an integrated circuit. The method comprises: providing a mask, the mask defining a pattern of laterally or longitudinally oriented signal lines of which a portion are tapered to provide progressively reduced parasitic sidewall capacitance in the portion of the integrated circuit; and patterning the signal lines responsive to the mask to form the portion of the integrated circuit.

Another embodiment of the present invention includes an integrated circuit (IC) having a plurality of metal traces. The IC further includes: at least part of a first metal trace having a tapered shape, a first position along the tapered shape, and a second position, spaced from the first position, along the tapered shape; and a part of a second metal trace positioned adjacent to the at least part of the first metal trace and causing capacitance between the at least part of a first metal trace and the part of the second metal trace, where the capacitance approximately decreases in value from the first position to the second position.

BRIEF DESCRIPTION OF THE DRAWINGS

Accompanying drawing(s) show exemplary embodiment(s) in accordance with one or more aspects of the present invention; however, the accompanying drawing(s) should not be taken to limit the present invention to the embodiment(s) shown, but are for explanation and understanding only.

DETAILED DESCRIPTION OF THE DRAWINGS

For purposes of clarity, only sidewall parasitic capacitance has been described; however, interlayer parasitic capacitance also exists in some integrated circuits. Notably, though the description that follows is for sidewall parasitic capacitance, the same description equally applies to interlayer parasitic capacitance. Furthermore, though the description that follows is for a tapered clock line, in should be appreciated that any signal line for a signal that transitions from one logic state to another, such as transitions from high-to-low and low-to-high logic levels, during operation may be used.

Figure 3A:
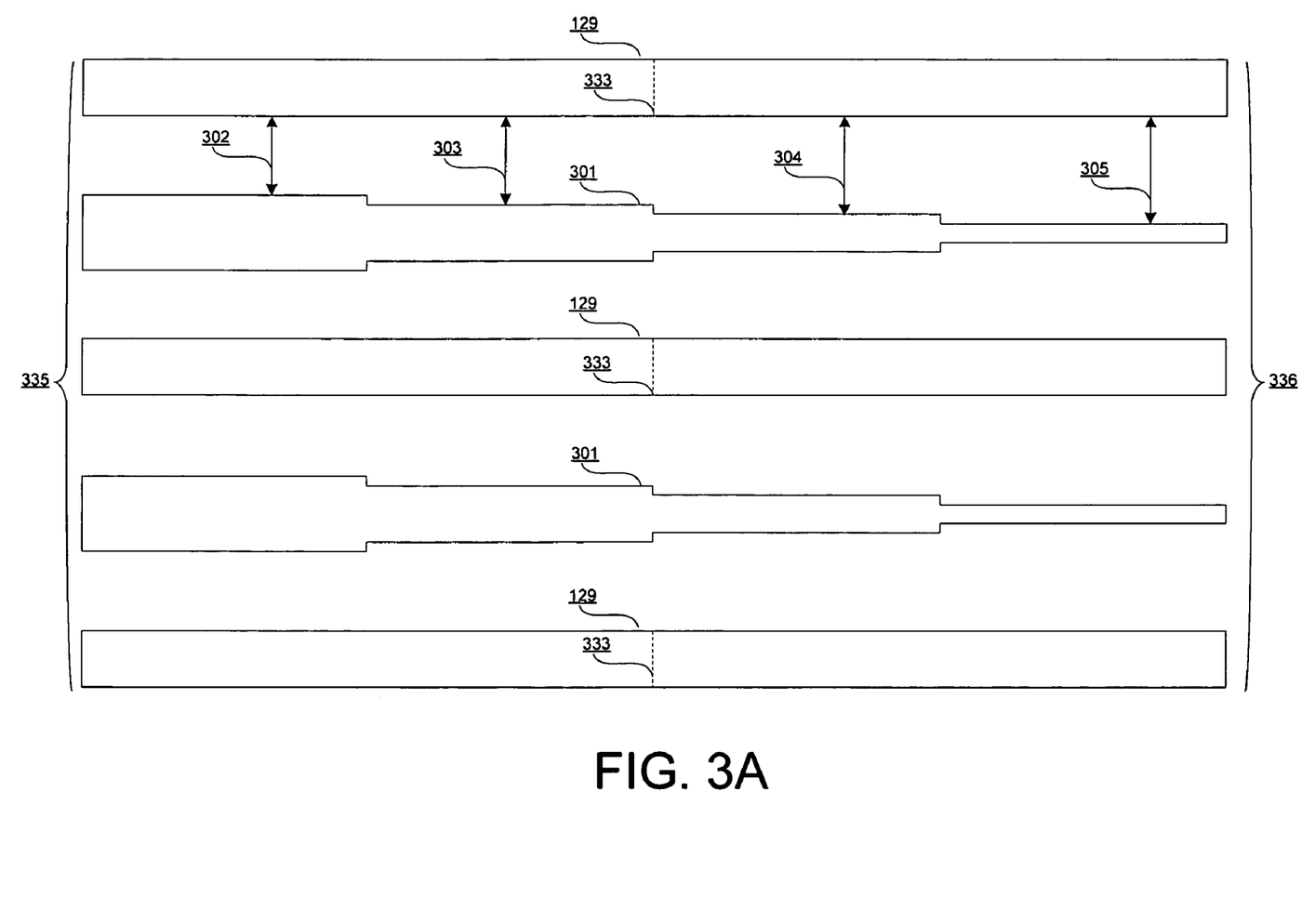
FIG. 3A is a top elevation view depicting an exemplary embodiment of tapered clock lines.

FIG. 3A is a top elevation view depicting an exemplary embodiment of tapered clock lines 301. Tapered clock lines 301 are stepped widthwise inwardly on each side to form a taper, namely, made gradually thinner widthwise toward one end in progressive stepwise indentations. Notably, the tapering goes from a source side 335 to a sink side 336. For these and other tapered signal lines described herein, such tapered signal lines generally go from wide-to-narrow corresponding to the source-to-sink direction. Because a plurality of tapered clock lines 301 are used, to protect against cross-talk, shielding lines 129 are disposed between consecutive tapered clock lines 301. Notably, because tapering of tapered clock lines 301, spatial separation of tapered clock lines 301 and non-tapered shielding lines 129 changes from discrete location to discrete location. Thus, sidewall separation distance 302 is smaller than sidewall separation distance 303; sidewall separation distance 303 is smaller than sidewall separation distance 304; and sidewall separation distance 304 is smaller than sidewall separation distance 305. Notably, the number of stepwise indentations may be one or more, and is not limited to three stepwise indentations as shown. However, performance is enhanced by having more than one stepwise indentation. Furthermore, though tapered clock lines 301 are shown, the same effect may be obtained by having tapered shielding lines and non-tapered clock lines, or by having a combination of tapered shielding lines and tapered clock lines. The net result in any embodiment is that parasitic capacitance gets gradually smaller in one direction from a source or input side to a sink or output side.

Notably, because spatial separation gradually increases, cross-talk becomes less of a problem with sufficient spatial separation. Accordingly, in some implementations, shielding lines 129 may be omitted, or reduced in length as indicated by dashed-lines 333.

Figure 3B:
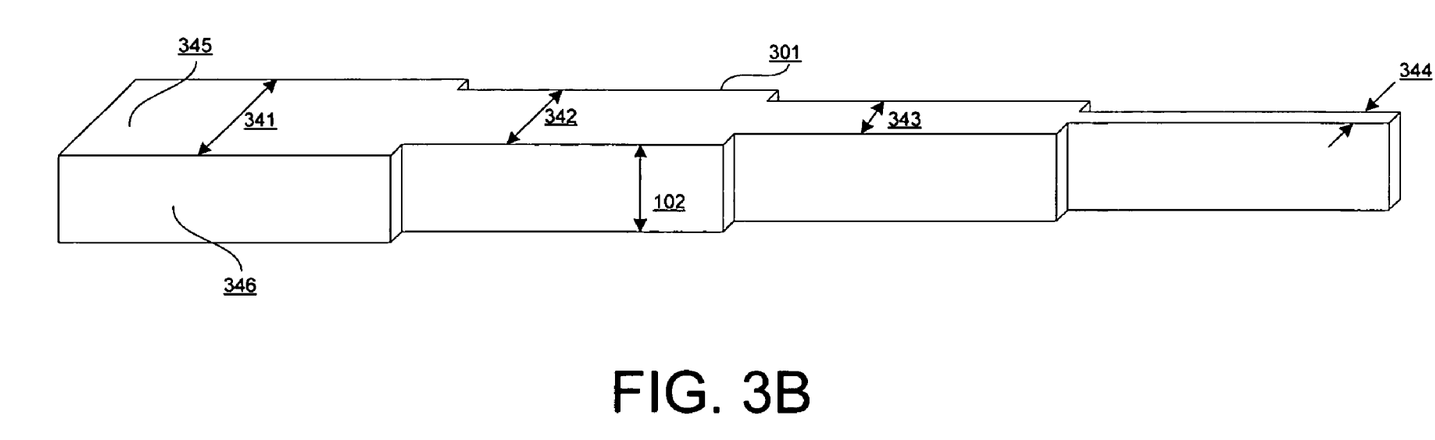
FIG. 3B is a perspective view depicting a tapered clock line of FIG. 3A.

FIG. 3B is a perspective view depicting a tapered clock line 301 of FIG. 3A. Notably, though width 341 is larger than width 342, sidewall height 102 is substantially the same. Furthermore, widths 341, 342, 343 and 344 reflect a progression of inward stepwise indentations to taper signal line 301 in increments, while sidewall height 102 is at least substantially the same. FIG. 3B in one embodiment shows a tapered conductive wire or tapered metal trace with a substantially horizontal surface 345 and a substantially vertical surface 346. The substantially vertical surface may, in this case, be referred to as a sidewall with height 102.

Figure 3C:
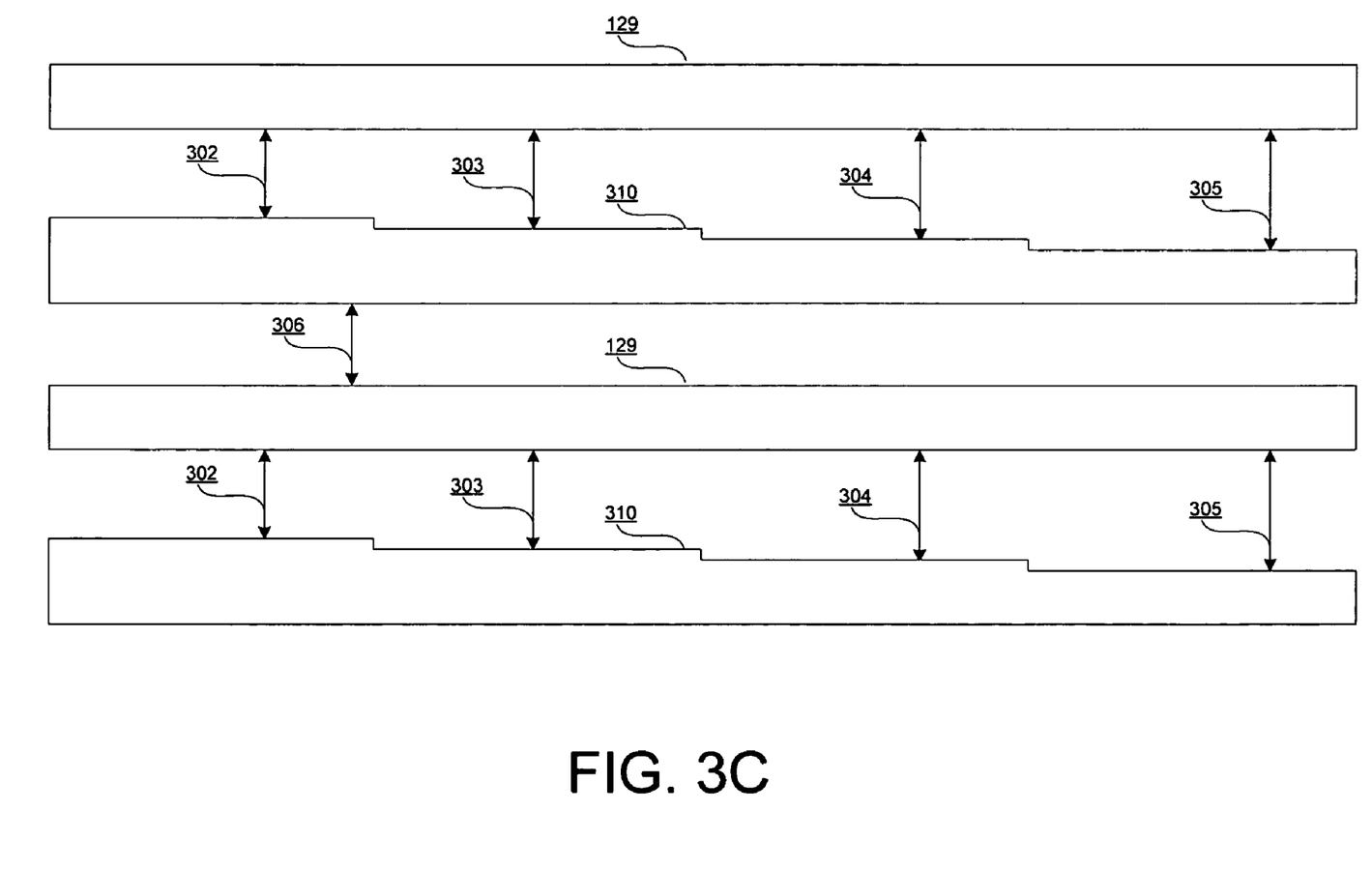
FIG. 3C is a top elevation view depicting an exemplary embodiment of tapered signal lines.

FIG. 3C is a top elevation view depicting an exemplary embodiment of tapered signal lines 310. In this exemplary embodiment, spatial separation distances 302, 303, 304 and 305 between a shielding line 129 and a tapered signal line 310 get progressively larger on one side of tapered signal line 310, and spatial separation distance 306 stays at least substantially the same on an opposite side of tapered signal line 310. Again, stepped tapering on only one side of a line may be done on a shielding line or a signal line or a combination thereof provided parasitic capacitance progressively decreases from an input end to an output end.

Figure 3D:
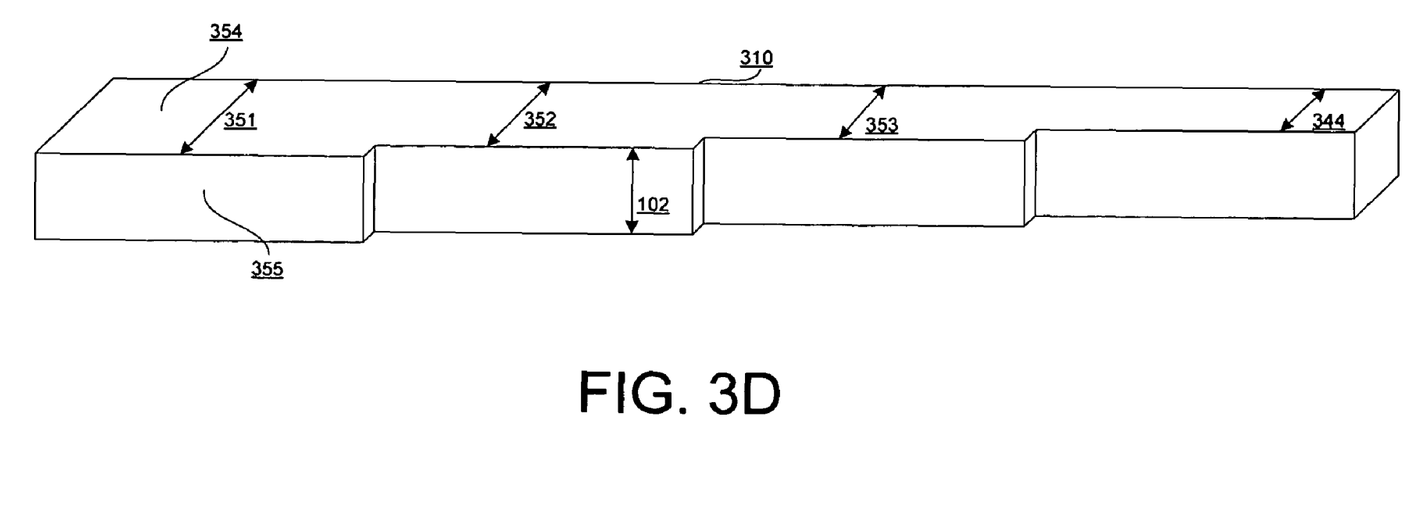
FIG. 3D is a perspective view depicting a tapered signal line of FIG. 3C.

FIG. 3D is a perspective view depicting a tapered signal line 310 of FIG. 3C. Notably, though width 351 is larger than width 352, sidewall height 102 is substantially the same. Furthermore, widths 351, 352, 353 and 344 reflect a progression of inward stepwise indentations to taper signal line 310 in increments, while sidewall height 102 is at least substantially the same throughout the extent of tapered signal line 310. FIG. 3D in one embodiment shows a tapered conductive wire or tapered metal trace with a substantially horizontal surface 354 and a substantially vertical surface 355. The vertical surface may, in this case, be referred to as a sidewall with height 102.

Figure 4A:
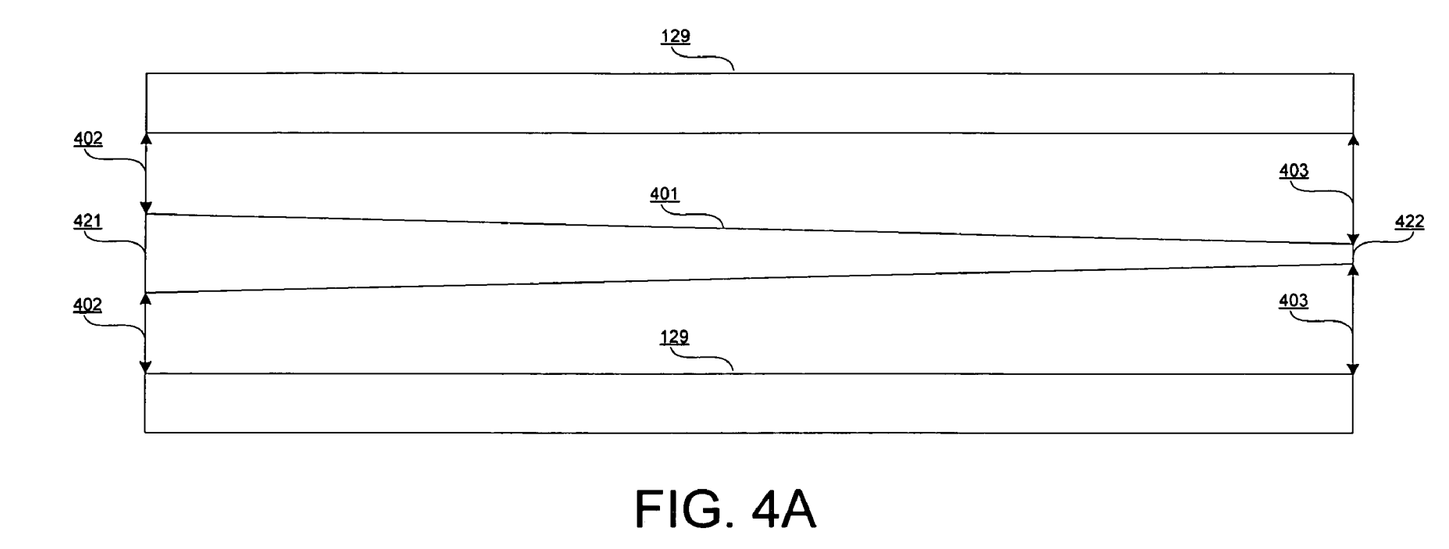
FIG. 4A is a top elevation view depicting an exemplary embodiment of a continuously tapered signal line.

FIG. 4A is a top elevation view depicting an exemplary embodiment of a tapered signal line 401. Rather than stepwise indentations, tapered signal line substantially progressively and continuously slopes inward on both sides such that an input end 421 is wider than an output end 422. Accordingly, spatial separation distance 403 from tapered signal line 401 to shielding line 129 at an output end 422 is longer than spatial separation distance 402 to shielding line 129 at an input end 421.

Figure 4B:
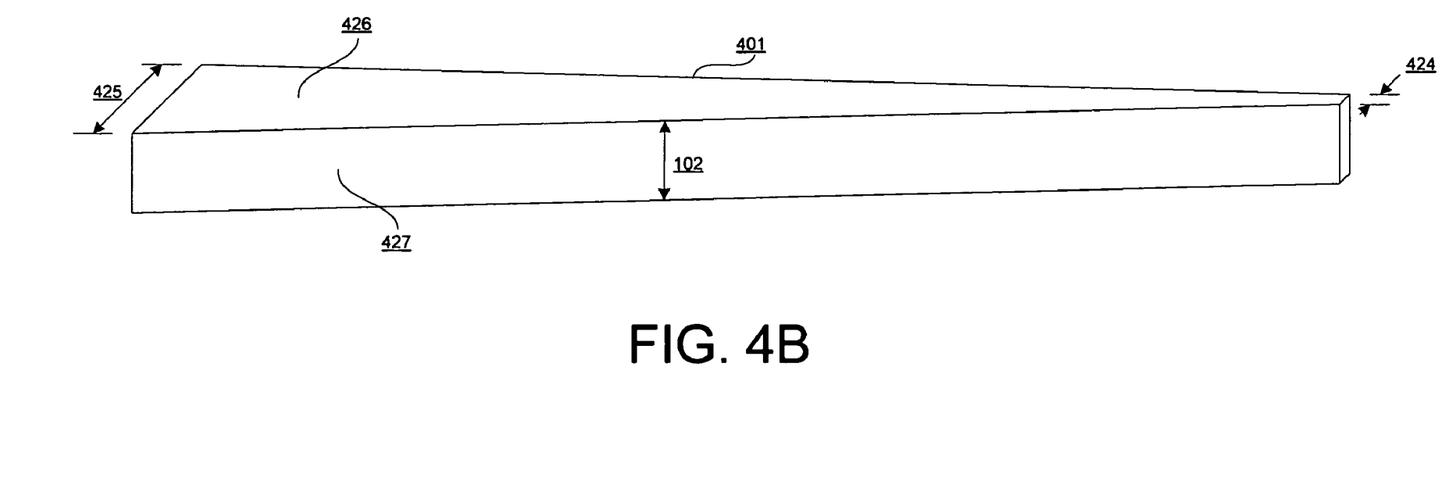
FIG. 4B is a perspective view depicting a tapered signal line of FIG. 4A.

FIG. 4B is a perspective view depicting a tapered signal line 401 of FIG. 4A. Width 425 at an input end of tapered signal line 401 is wider than width 424 at an output end of tapered signal line 401, and width of tapered signal line 410 substantially progressively and continuously narrows from an input end to an output end, while sidewall height 102 is at least substantially the same throughout the extent of tapered signal line 401. FIG. 4B in one embodiment shows a tapered conductive wire or tapered metal trace with a substantially horizontal surface 426 and a substantially vertical surface 427. The vertical surface may, in this case, be referred to as a sidewall with height 102.

Figure 4C:
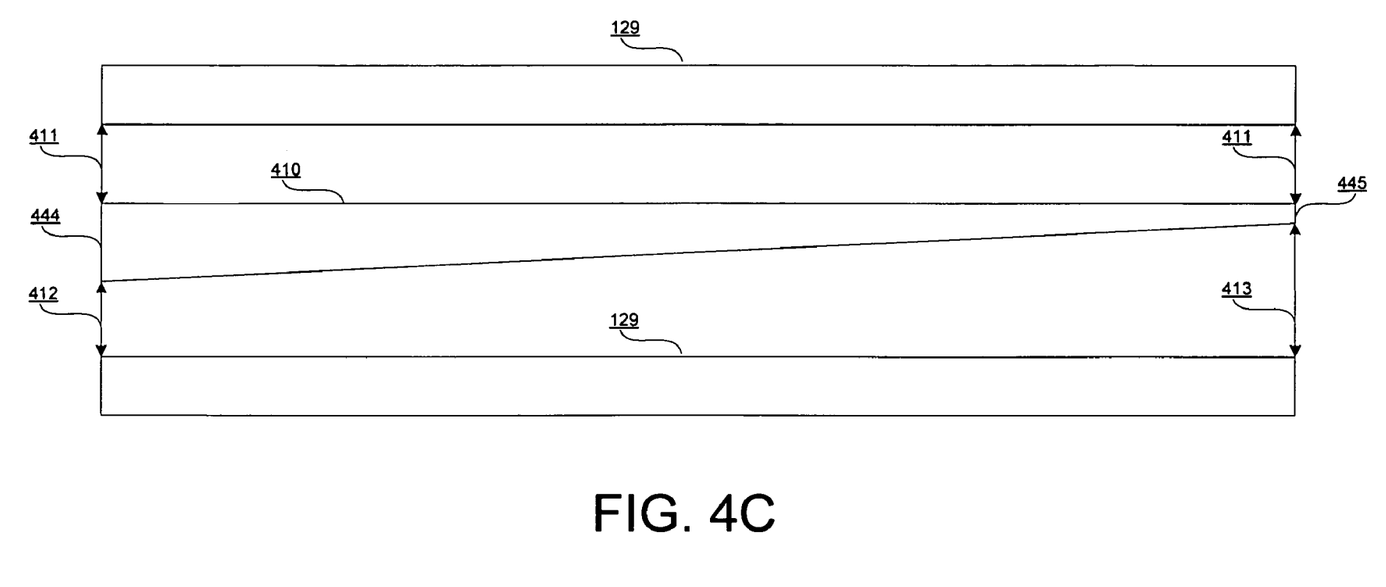
FIG. 4C is a top elevation view depicting an exemplary embodiment of a tapered signal line.

FIG. 4C is a top elevation view depicting an exemplary embodiment of a tapered signal line 410. Rather progressively sloping inward on both sides, tapered signal line at least substantially progressively and continuously slopes inward on one side and is at least substantially non-sloping on another side such that an input end 445 is wider than an output end 444. Accordingly, spatial separation distance 413 from tapered signal line 410 to shielding line 129 at an output end 444 is longer than spatial separation distance 412 to the same shielding line 129 at an input end 445, and spatial separation distance 411 from tapered signal line 410 to another shielding line 129 on an opposite side of the side is at least substantially constant.

Figure 4D:
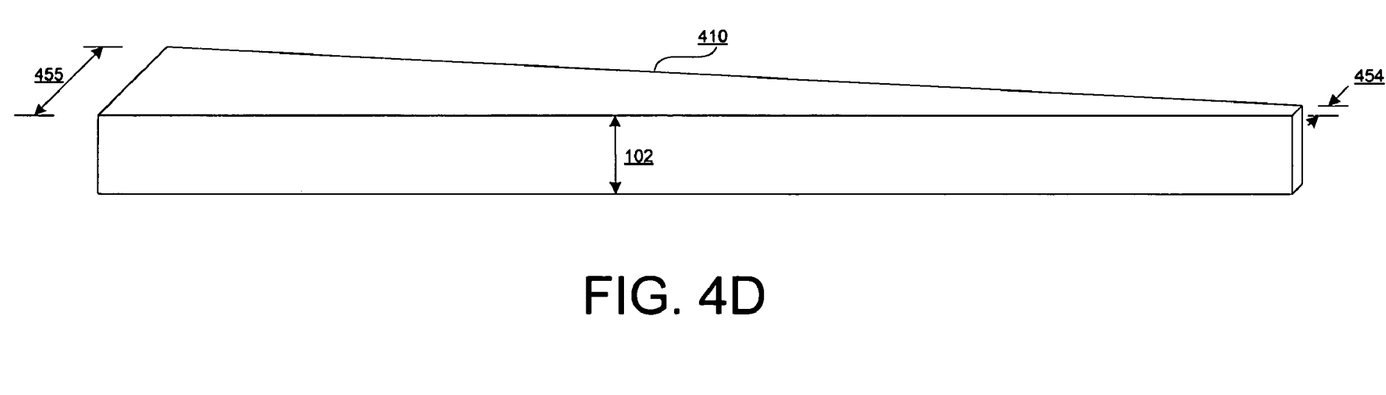
FIG. 4D is a perspective view depicting a tapered signal line of FIG. 4C.

FIG. 4D is a perspective view depicting a tapered signal line 410 of FIG. 4C. Width 455 at an input end of tapered signal line 410 is wider than width 454 at an output end of tapered signal line 410, and width of tapered signal line 410 substantially progressively and continuously narrows from an input end to an output end, while sidewall height 102 is at least substantially the same throughout the extent of tapered signal line 410. This narrowing is responsive to a tapered side of tapered signal line 410, as a side opposite the tapered side of tapered signal line 410 is at least substantially not tapered.

Figure 5A:
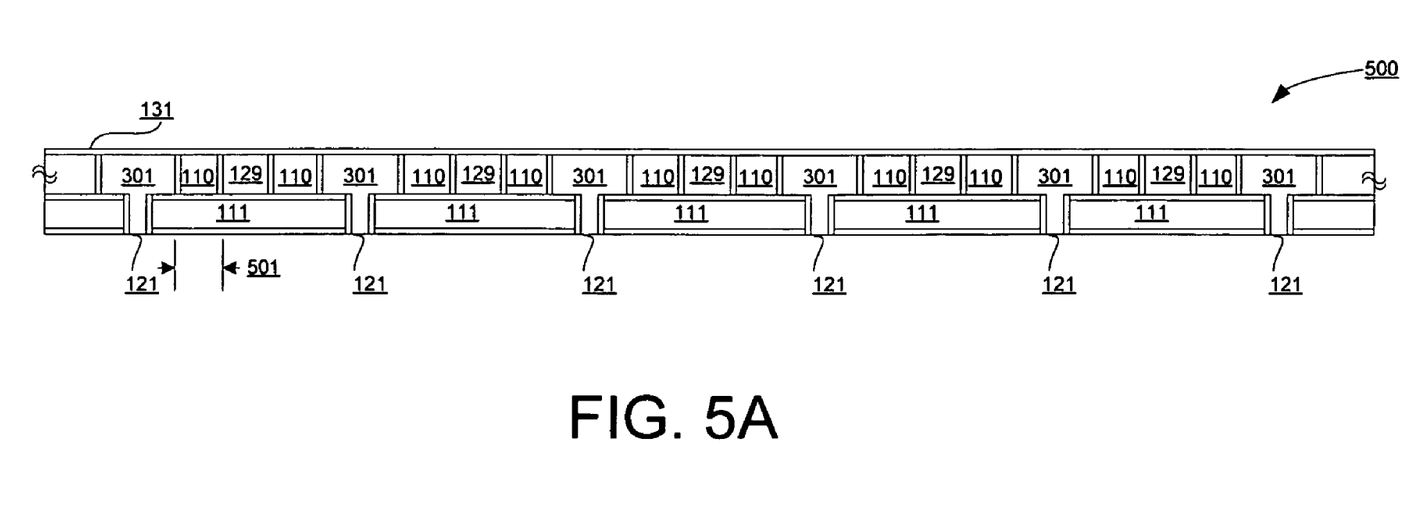
FIGS. 5A and 5B are cross-sectional views depicting exemplary embodiments of tapered signal lines disposed in a portion of an integrated circuit.
Figure 5B:
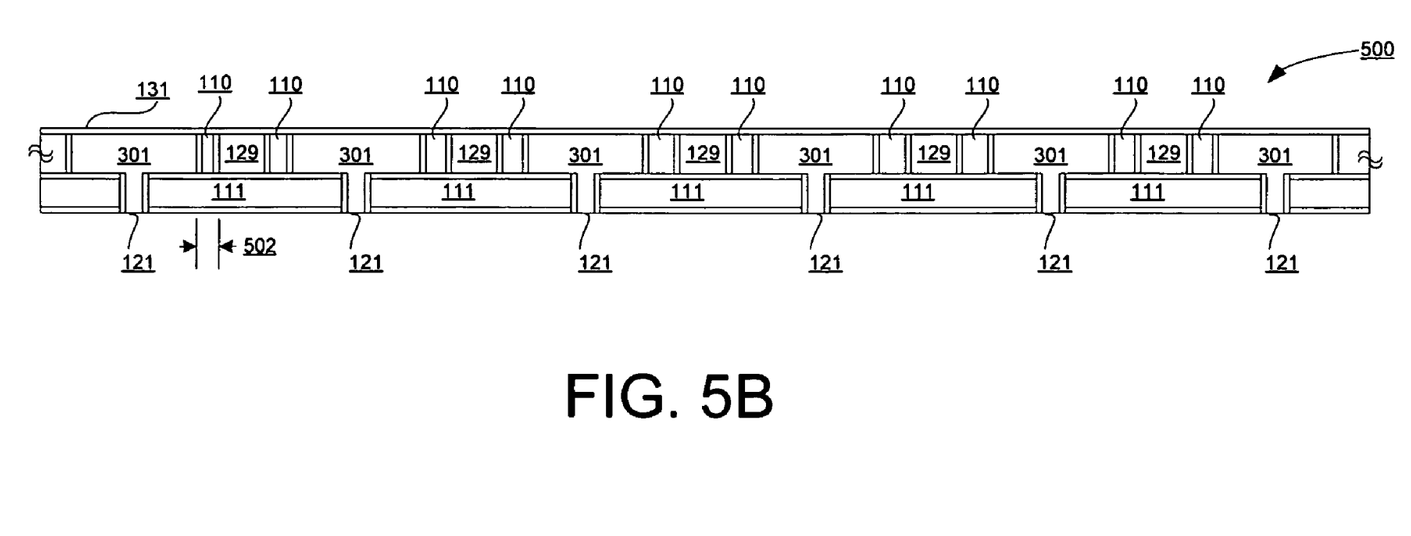

FIGS. 5A and 5B are cross-sectional views depicting exemplary embodiments of tapered signal lines 301 disposed in a portion of an integrated circuit 500. The cross-section depicted in FIG. 5A is taken from a narrower width location than that of the cross-section depicted in FIG. 5B. Accordingly, spatial separation distance 501 of FIG. 5A is wider than spatial separation distance 502. Thus, for the two respective locations, interlayer dielectric layer 110 of FIG. 5A is wider than at the cross-section of interlayer dielectric layer 110 of FIG. 5B. Notably, any barrier layer(s), if any, lining trench sidewalls will contribute to the overall spatial separation distance.

Figure 6:
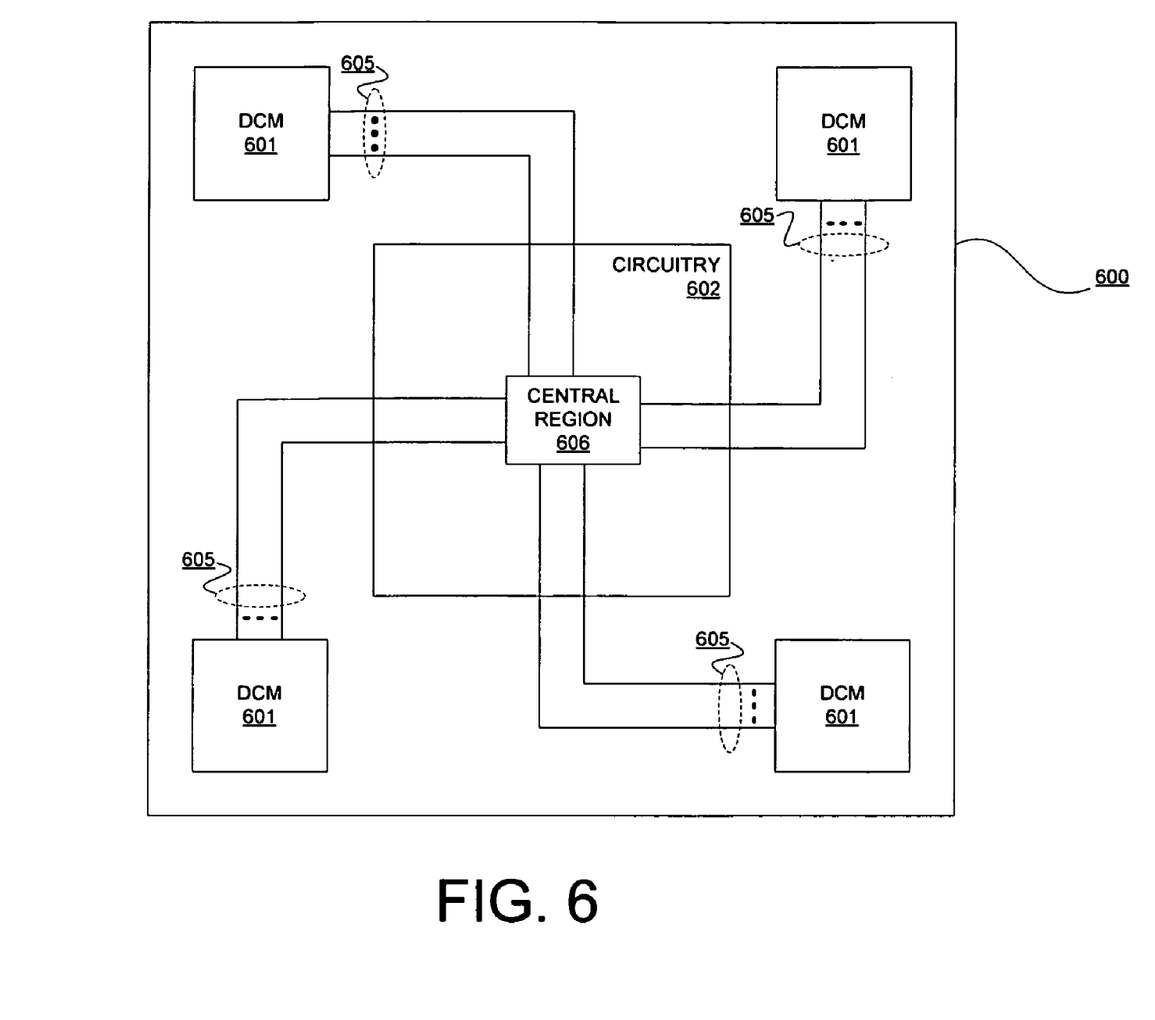
FIG. 6 is a block diagram depicting an exemplary embodiment of an integrated circuit having tapered clock lines.

FIG. 6 is a block diagram depicting an exemplary embodiment of an integrated circuit 600 having tapered clock lines 605. Tapered clock lines 605 are from respective digital clock modules 601 and are provided to circuitry 602, which may include configurable circuitry. Conventionally, a clock distribution tree, such as an H-tree, is used to distribute clock signals within circuitry 602, where tapered clock lines 605 may extend into a centrally located area, such as central region 606, of circuitry 602 for further distribution to multiple branches via drivers, such as buffers or inverters. Notably, tapered clock lines may be used at any branch, some branches or all branches of a clock network 610.

Figure 7:
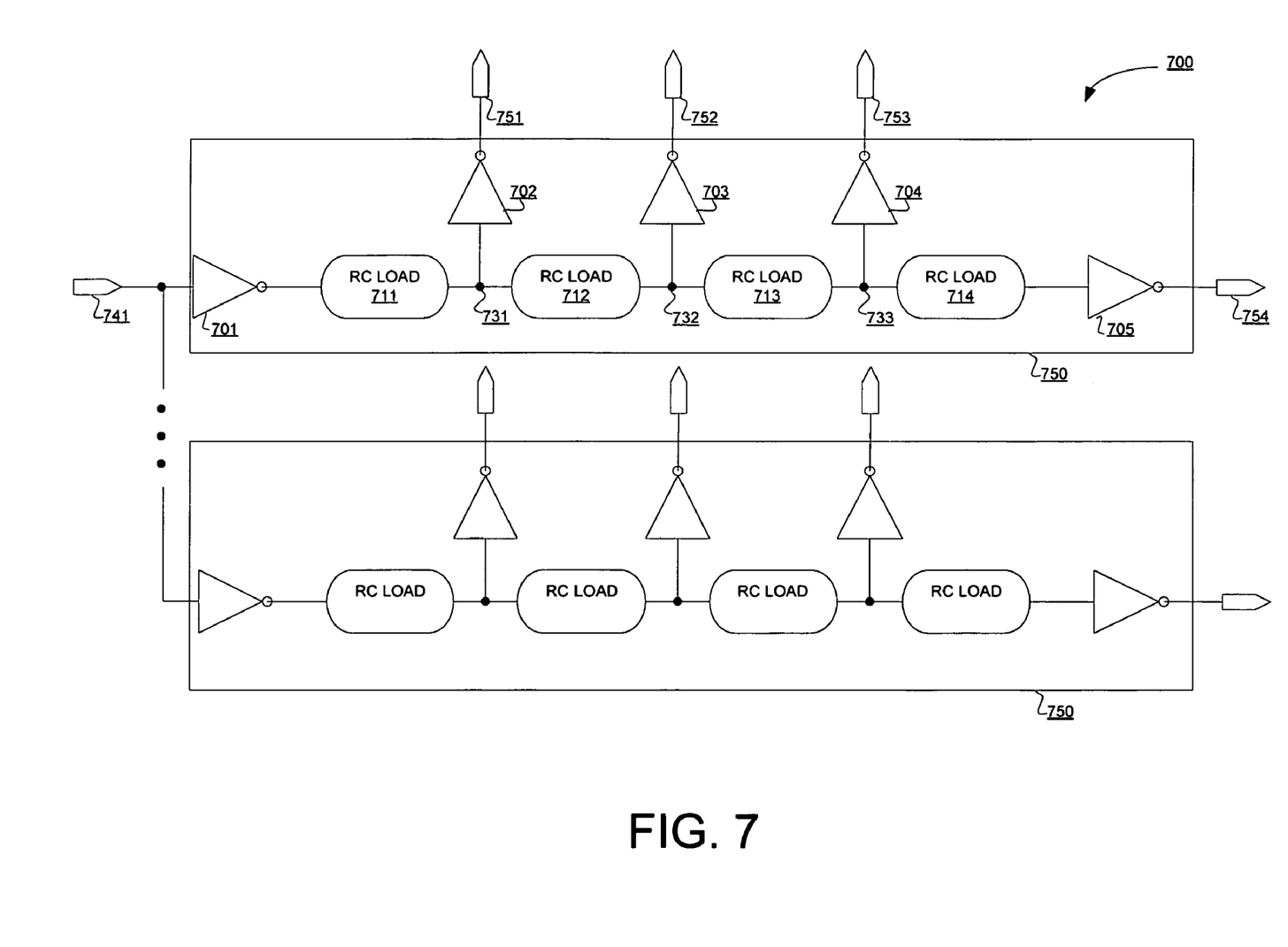
FIG. 7 is a schematic representation of a clock distribution circuit.

FIG. 7 is a schematic representation of a clock distribution circuit 700. Clock distribution circuit 700 may include multiple branches 750. Accordingly, for clarity, only a single branch is described in detail to avoid unnecessary repeated description. Clock signal input 741 is provided to an input driver, such as an inverter 701. Taps 731, 732 and 733, such as from via interconnects, are taken at different RC load locations of a tapered signal line, where RC load includes load of the tapered signal line and from parasitic capacitance. Thus, for example, a tapered signal line 301 of FIG. 3 may be made of aluminum and have taps proximal to stepped changes in width, such as at widths of approximately 5 microns (μ), 4μ, 3μ and 1.5μ, where these transitions are approximately uniformly spaced, such as approximately 2.4 mm from output of inverter 701 to tap 731, from tap 731 to tap 732, from tap 732 to tap 733, and from tap 733 to input of an output driver, such as inverter 705. Notably, uniform spacing is not needed between taps, and such spacing may be tailored for application. Using a 1.5μ distance to shielding lines on each side of a 5μ wire, spatial separation distance on each side of the tapered clock line for the above example would be 1.5μ, 2μ, 2.5μ and 3μ. Output 754 from inverter 705 may be for another branch 750 or another portion of branch 750. Accordingly, RC loads get progressively smaller from input to output. Thus, RC load 711 is larger than RC load 712, RC load 712 is larger than RC load 713, and RC load 713 is larger than RC load 714. It should be understood that known optimization techniques may be used for determining interval distance between taps and associated widths of a tapered signal line. In this optimization, it should be appreciated not only do line and sidewall parasitic capacitance change with tapering, but also top and bottom interlayer parasitic capacitance and resistance. With respect to interlayer parasitic capacitance, as a tapered signal line is narrowed, there is less area overlap with lines extending above or below such a tapered signal line. Furthermore, resistance increases as a tapered signal line is narrowed. Due to electrical properties associated with the signal being propagated and the material(s) being used to form the tapered signal line, line width narrowed beyond a threshold may actually have an adverse affect. Thus, this technology is more suited to higher-level conductive layers where line widths are approximately at least 1μ wide, depending on implementation. However, line widths less than 1μ wide may be used for enhanced signal performance. Simply stated, thresholds may be determined for where reduction in capacitance beats out increase in resistance.

It should be appreciated that with use of sub-micron, and more particularly sub-quarter micron, lithography used for forming drivers, driver capacitance, or more particularly gate capacitance of transistors, has become much smaller in contrast to line capacitance. Thus, multiple taps do not reduce the effectiveness of tapering of signal lines.

However, by tapering a signal line, parasitic capacitance is gradually reduced from an input to an output, though the RC time constant of the signal line remains constant. For the tapered signal line, the RC time constant remains constant as the taper narrows. However, because shielding effective is spaced further away from such tapered signal line as it narrows, parasitic capacitance decreases more rapidly than it would if shielding was at the same amount of distance from the tapered signal line at all locations along the tapered signal line. Furthermore, capacitance of loads at each tap 731, 732 and 733 are significantly smaller than capacitance of the tapered signal line itself at each such tap. For example, as capacitance of buffer 704 approaches capacitance of RC load 713, signal propagation delay may not be reduced. Thus, signal propagation delay, for example from tap 731 to 732 is less than signal propagation delay from output of inverter 701 to tap 731, and signal propagation delay from tap 732 to tap 733 is greater than signal propagation delay from tap 733 to input of inverter 705. Accordingly, for clock signal distribution, signal skew, for example from tap 731 to tap 733, is reduced. This facilitates providing clock signals closer in time for synchronous operation.

Figure 8:
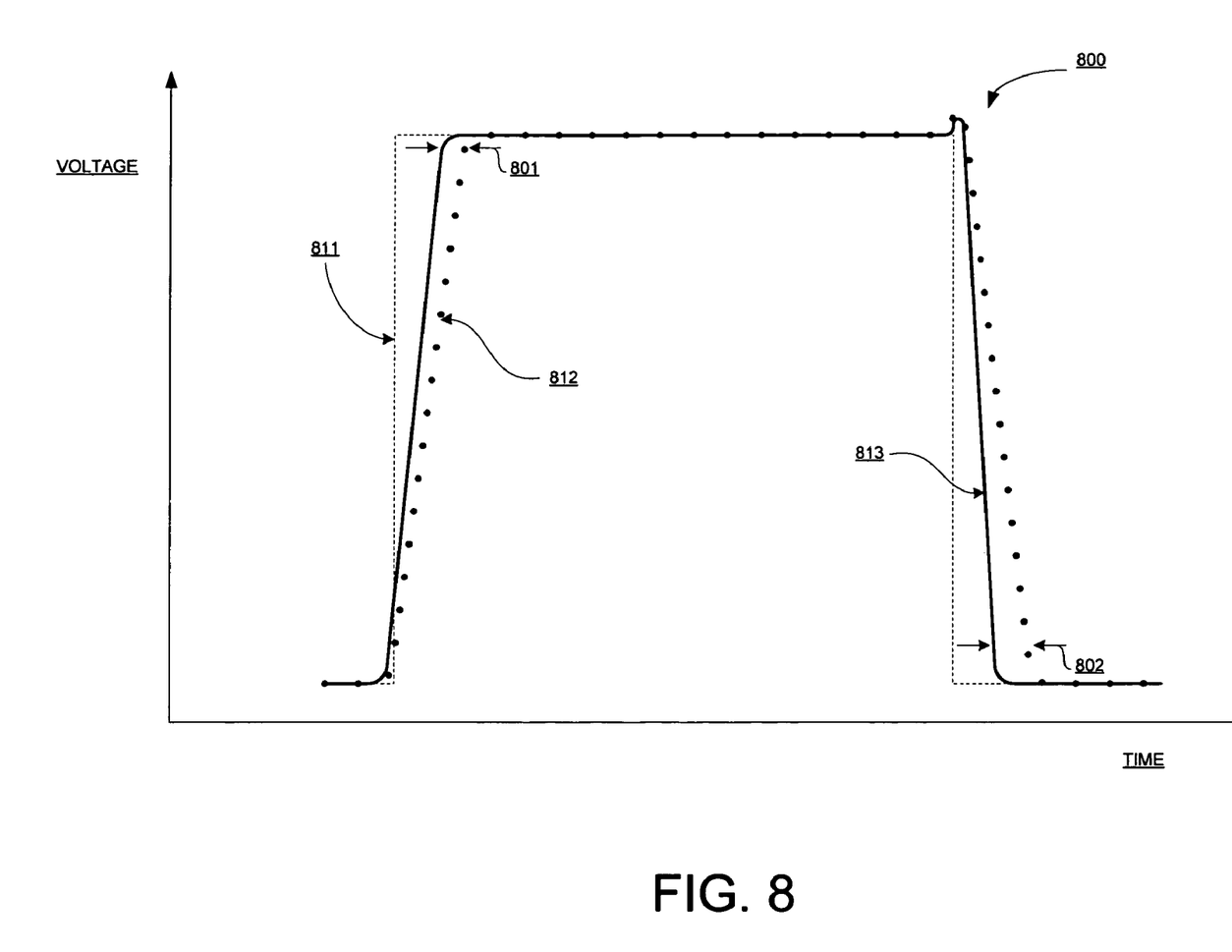
FIG. 8 is a signal diagram depicting an exemplary embodiment of a signal pulse.

Additionally, because capacitance effectively reduce, rise time and fall time of a signal edge is reduced thereby conserving a signal pulse, as shown in the signal diagram of FIG. 8. FIG. 8 is a signal diagram depicting an exemplary embodiment of a signal pulse 800. Dashed line 811 is to show an ideal signal pulse, and dotted line 812 is to indicate what a prior art signal pulse may look like. Signal pulse 813 is a portion of a signal obtained through use of a tapered signal line. As may be seen from examination of FIG. 8, rise time and fall time of signal pulse 813 more closely approximates an ideal signal pulse than the signal pulse of the prior art. There is also a reduction in duty cycle distortion.

Time spaces 801 and 802 indicate approximate improvements in rise time and fall time. Because rise and fall times are faster, pulse width is enhanced for a limited duration of time. For example, for approximately a 3.7 nanosecond pulse width, approximately 17 picoseconds may be saved. Notably, for this example, the type of material used was aluminum. However, a copper dual damascene process may be used.

Advantageously, because capacitive loading is reduced, smaller drivers may be used thereby conserving layout area.

Furthermore, because rise and fall times are faster, less distortion of duty cycle may be achieved.

Figure 9:
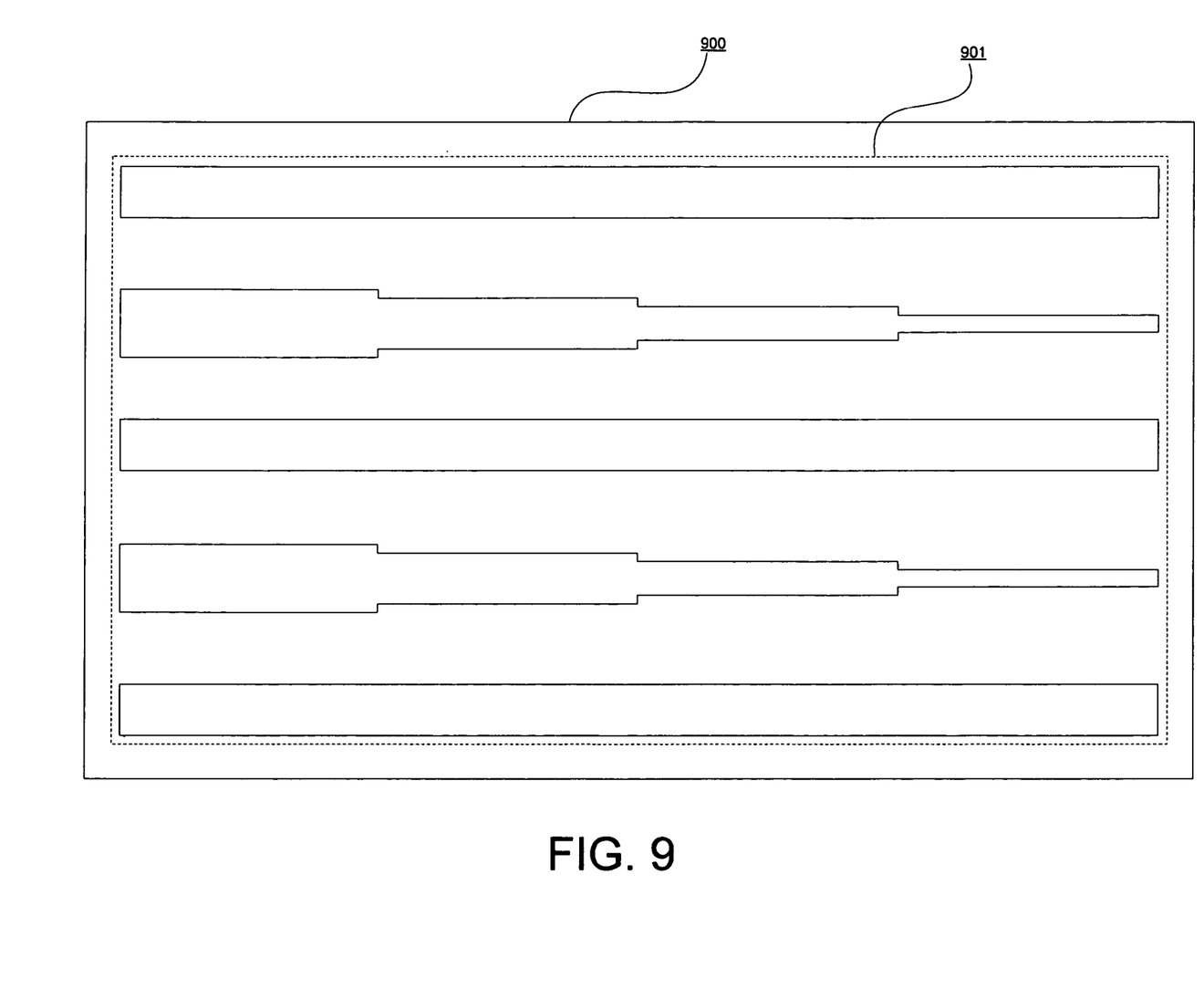
FIG. 9 is a top elevation view of a mask defining a pattern of a stepwise tapered signal line.

Referring to FIG. 9, there is shown a top elevation view of a mask 900 defining a pattern 901. Pattern 901 defines outlines of shield lines and signal lines at least one type of which is stepwise tapered. Mask 900 may be used to form tapered lines, where rounding at corners in the finished tapered lines product may result due to lithography.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. For example, though a clock line is described, for example to reduce clock skew to clock pins by reducing differences in propagation time of a clock signal, it may be desirable to intentionally have delay built into a line, such as in a multiple tap delay line. For example, a fine grain delay line may be formed using stepwise indentations of a signal line instead of either serially connected buffers or inverters. Claim(s) listing steps do not imply any order of the steps.

What is claimed is:

1. An integrated circuit (IC) having a plurality of metal traces, the IC further comprising:
    at least part of a first metal trace of the plurality of metal traces comprising a tapered shape, a first position along the tapered shape, and a second position along the tapered shape, the second position spaced from the first position, wherein the first position and the second position along the tapered shape are formed in a metal layer of the IC; and
    a part of a second metal trace of the plurality of metal traces positioned adjacent to the at least part of the first metal trace and causing capacitance between the at least part of a first metal trace and the part of the second metal trace, the capacitance approximately decreasing in value along the at least part of the first metal trace, wherein one of the first metal trace and the second metal trace comprises a signal line and the other of the first metal trace and the second metal trace comprises a shielding line.

2. The IC of claim 1 wherein the plurality of metal traces are located in the same layer of the IC.

3. The IC of claim 1 wherein the second metal trace is a non-tapered shielding line.

4. The IC of claim 1 further comprising a dielectric interposed between the at least part of the first metal trace and the part of the second metal trace.

5. In an integrated circuit, a layer including a plurality of conductive wires, the layer comprising:
    a first wire having a proximal end and a distal end, the proximal end having a first width, the distal end having a second width, the second width being less than the first width, the first wire tapered from the proximal end to the distal end, the first wire further having first sidewalls; and
    a second wire spaced apart from the first wire, the second wire having second sidewalls, the first wire and the second wire are each horizontally disposed along side each other, wherein a sidewall capacitor is created with a sidewall of the first sidewalls and a sidewall of the second sidewalls, the capacitor capacitance progressively reduced responsive to the tapering of the first wire, wherein one of the first wire and the second wire comprises a signal line and the other of the first wire and the second wire comprises a shielding line.

6. The layer of claim 5 wherein the first wire is stepwise tapered.

7. The layer of claim 5 wherein the first wire is continuously tapered.

8. The layer of claim 5 wherein the signal line comprises clock signal line.

9. The layer of claim 5 wherein the shielding line comprises a fixed voltage signal line.

10. The layer of claim 5 wherein the second wire extends from a proximal end to a distal end, the proximal end of the second wire having a third width which is greater than a fourth width of the distal end of the second wire and corresponding to the proximal end of the first wire, and wherein the second wire is tapered from the proximal end to the distal end.

11. The IC of claim 1 wherein the first metal trace and the second metal trace are located in different layers of the IC.

12. The IC of claim 1 wherein the signal line comprises a clock signal line.

13. The IC of claim 12 wherein the shielding line comprises a fixed voltage signal line.

14. An integrated circuit (IC) having a plurality of metal traces, the IC further comprising:
    a first metal trace comprising a clock signal line having a proximal end and a distal end, the proximal end having a first width and the distal end having a second width, wherein the second width is less than the first width;
    a second metal trace comprising a shielding line spaced apart from the first metal trace and having a proximal end and a distal end, the first metal trace and the second metal trace being disposed along side each other and creating a capacitance, wherein one of the first metal trace and the second metal trace is tapered from a corresponding proximal end to a corresponding distal end; and
    a plurality of taps of the one of the first metal trace and the second metal trace between the corresponding proximal end and the corresponding distal end, the plurality of taps enabling a clock distribution network.

15. The IC of claim 14 wherein the first metal trace and the second metal trace are on the same layer.

16. The IC of claim 14 wherein the shielding line comprises a power line or a ground line.

17. The IC of claim 14 wherein tapering comprises stepwise tapering in the width of the metal trace.

18. The IC of claim 14 wherein the other metal trace of the first metal trace and the second metal trace is tapered from the proximal end to the distal end.

19. The IC of claim 14 wherein the first metal trace and the second metal trace extend from a centrally located area.

20. The IC of claim 14 wherein the clock distribution network comprises a clock distribution tree having tapered metal traces on a plurality of branches of the clock distribution tree.

* * * * *